(12) United States Patent
Ebihara et al.

(10) Patent No.: US 11,094,815 B2
(45) Date of Patent: Aug. 17, 2021

(54) SEMICONDUCTOR DEVICE AND POWER CONVERSION APPARATUS

(71) Applicant: Mitsubishi Electric Corporation, Tokyo (JP)

(72) Inventors: Kohei Ebihara, Tokyo (JP); Naruto Miyakawa, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 57 days.

(21) Appl. No.: 16/492,610

(22) PCT Filed: Mar. 8, 2018

(86) PCT No.: PCT/JP2018/008916
§ 371 (c)(1),
(2) Date: Sep. 10, 2019

(87) PCT Pub. No.: WO2018/207449
PCT Pub. Date: Nov. 15, 2018

(65) Prior Publication Data
US 2021/0143272 A1 May 13, 2021

(30) Foreign Application Priority Data

May 12, 2017 (JP) .............................. JP2017-095215

(51) Int. Cl.
*H01L 29/78* (2006.01)
*H01L 29/06* (2006.01)

(52) U.S. Cl.
CPC ...... *H01L 29/7811* (2013.01); *H01L 29/0619* (2013.01); *H01L 29/7805* (2013.01)

(58) Field of Classification Search
CPC ............. H01L 29/7811; H01L 29/7805; H01L 29/0619; H01L 2924/12032;
(Continued)

(56) References Cited

U.S. PATENT DOCUMENTS

| 6,175,143 | B1 | 1/2001 | Fujihira et al. |
| 7,384,826 | B2 * | 6/2008 | Richieri ............... H01L 29/417 438/140 |

(Continued)

FOREIGN PATENT DOCUMENTS

| JP | 10-335679 A | 12/1998 |
| JP | 2003-8014 A | 1/2003 |

(Continued)

OTHER PUBLICATIONS

International Search Report and Written Opinion dated May 22, 2018 for PCT/JP2018/008916 filed on Mar. 8, 2018, 6 pages including English Translation of the International Search Report.

*Primary Examiner* — Shahed Ahmed
(74) *Attorney, Agent, or Firm* — Xsensus LLP

(57) ABSTRACT

An object of the present invention is to provide a highly reliable semiconductor device by preventing precipitation of an oxide to prevent peeling of a resin layer. The semiconductor device includes: a resin layer provided so that at least a part of the resin layer extends on a front surface of a semiconductor layer on an outer peripheral side with respect to an outer peripheral end of a field insulating film; and a floating well region spaced apart from a termination well region in a surface layer of the semiconductor layer, the floating well region formed to be in contact with an outer peripheral end of the field insulating film to extend to the outer peripheral side with respect to the outer peripheral end of the field insulating film.

14 Claims, 13 Drawing Sheets

(58) Field of Classification Search
CPC ......... H01L 29/66143; H01L 29/66212; H01L 27/0766; H01L 2924/12031; H01L 29/872–8725; H01L 2924/12036; H01L 29/66136; H01L 29/868; H01L 29/6606; H01L 29/161–167; H01L 21/0445–0495; H01L 29/66053–66068
See application file for complete search history.

(56) References Cited

U.S. PATENT DOCUMENTS

| | | | |
|---|---|---|---|
| 10,923,571 B2 * | 2/2021 | Hikasa | .............. H01L 29/66325 |
| 2005/0280086 A1 | 12/2005 | Saito et al. | |
| 2014/0357026 A1 * | 12/2014 | Kobayashi | ........ H01L 21/26506 |
| | | | 438/135 |
| 2015/0001554 A1 | 1/2015 | Imai | |
| 2017/0317173 A1 * | 11/2017 | Uchida | ............. H01L 21/02167 |
| 2018/0233554 A1 * | 8/2018 | Mitsuzuka | .......... H01L 29/4238 |

FOREIGN PATENT DOCUMENTS

| | | |
|---|---|---|
| JP | 2004-158603 A | 6/2004 |
| JP | 2006-5275 A | 1/2006 |
| JP | 2012-195324 A | 10/2012 |
| JP | 2013-12652 A | 1/2013 |
| JP | 2013-211503 A | 10/2013 |

\* cited by examiner

F I G 1
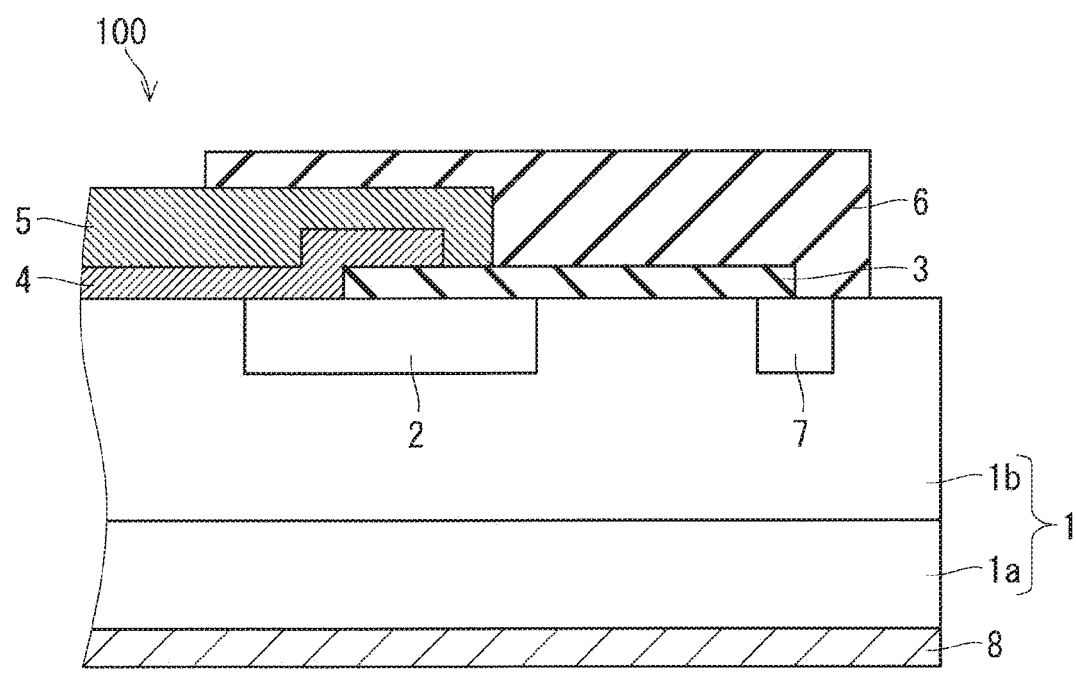

F I G. 5
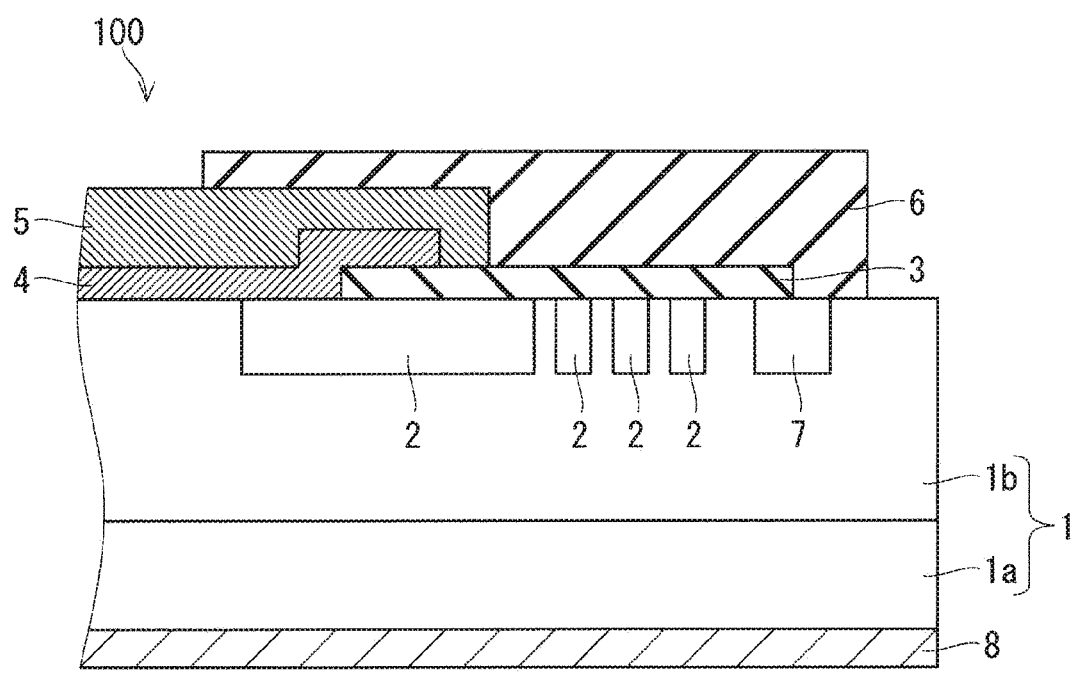

F I G. 6
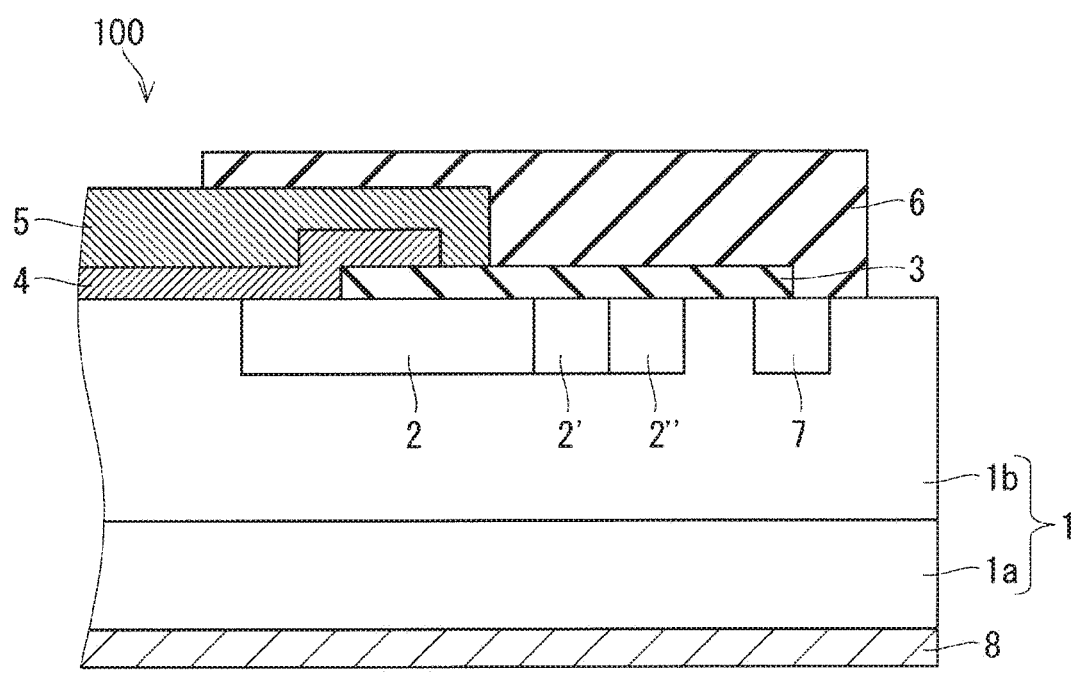

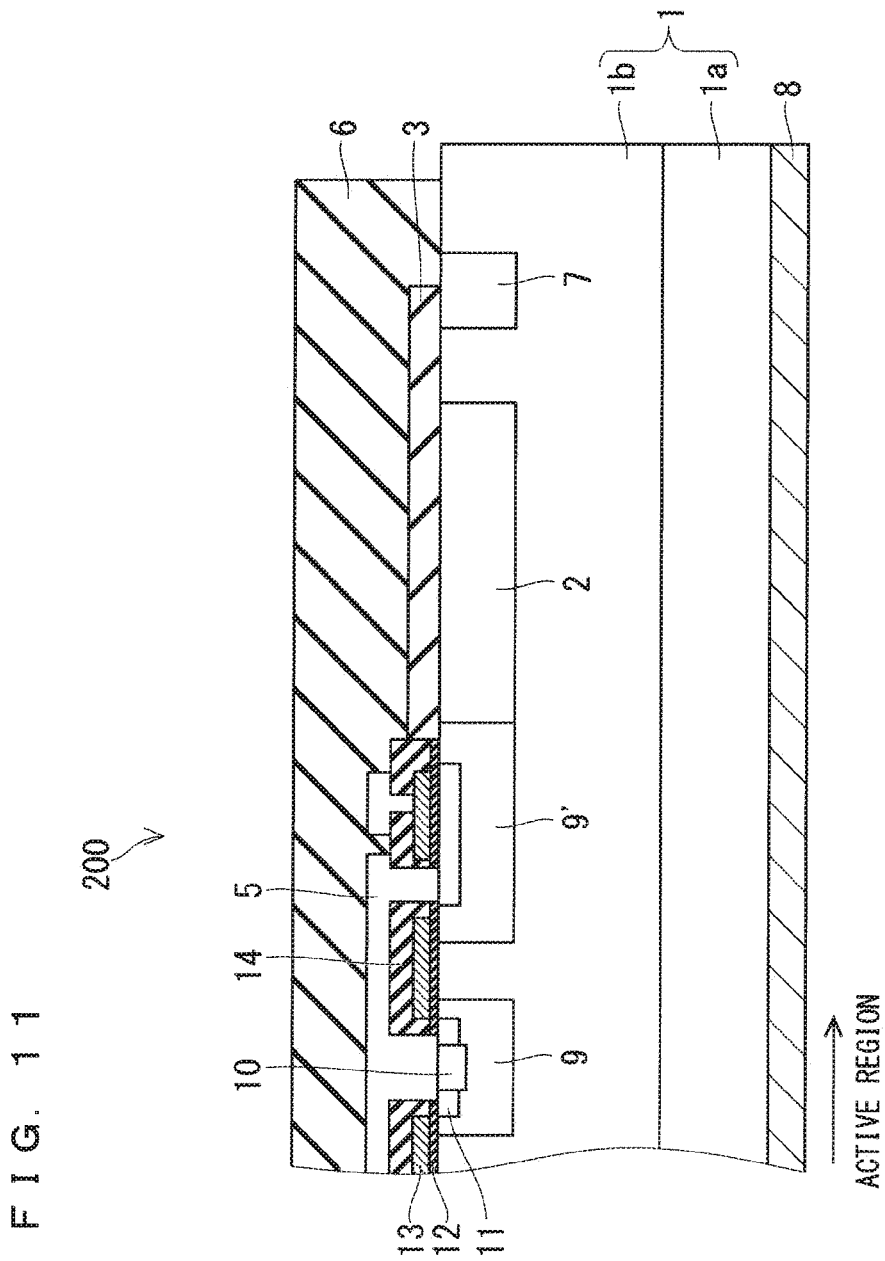

F I G. 1 2
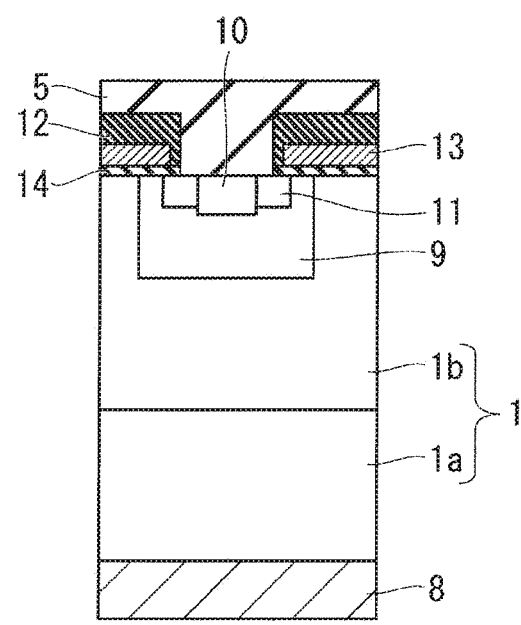

SEMICONDUCTOR DEVICE AND POWER CONVERSION APPARATUS

CROSS-REFERENCE TO RELATED APPLICATIONS

The present application is based on PCT filing PCT/JP2018/008916, filed Mar. 8, 2018, which claims priority to JP 2017-095215, filed May 12, 2017, the entire contents of each are incorporated herein by reference.

TECHNICAL FIELD

The present invention relates to a semiconductor device.

BACKGROUND ART

It is known that in a vertical semiconductor device used for a power device or the like, providing a p-type guard ring region (termination well region) in a so-called termination region in an n-type semiconductor layer so as to secure withstand voltage causes a depletion layer formed by the pn junction between the semiconductor layer and the guard ring region to reduce the electric field when a reverse voltage is applied (for example, Patent Document 1). In addition, in the Schottky barrier diode (SBD) described in Patent Document 1, a field insulating film is provided on the semiconductor layer in the termination region, and an outer peripheral end of a front surface electrode is formed to climb on the field insulating film. In such a semiconductor device, a protective film such as polyimide is formed to protect the front surface except for a part of a region on the front surface electrode on which wire bonding is performed (for example, Patent Document 2). In addition, the region in which a protective film such as a polyimide is formed may be sealed with resin such as gel.

PRIOR ART DOCUMENTS

Patent Documents

Patent Document 1: Japanese Patent Application Laid-Open No. 2012-195324
Patent Document 2: Japanese Patent Application Laid-Open No. 2013-211503

SUMMARY

Problem to be Solved by the Invention

In a semiconductor device including a protective film such as a polyimide or a gel for sealing, there is a case where the gel, polyimide, and the like contain moisture when the semiconductor device is used particularly in high humidity conditions, the semiconductor layer reacts with moisture to precipitate an oxide in a region not covered with the field insulating film on the outer periphery of the semiconductor chip. In this case, in some cases, pushing up the resin layer such as the front surface protective film or the sealing gel by the precipitated oxide causes peeling, a leak path is formed through the cavity formed by the peeling, and the semiconductor chip is made defective.

The present invention has been made to solve the above-described problems, and it is an object of the present invention to provide a highly reliable semiconductor device by reducing the precipitation of an oxide to prevent peeling of a resin layer.

Means to Solve the Problem

The semiconductor device according to the present invention includes:
a semiconductor substrate;
a semiconductor layer formed on the semiconductor substrate, the semiconductor layer being a first conductivity type;
a front surface electrode provided on a front surface side of the semiconductor layer;
a termination well region in which at least a part of the termination well region is formed to extend on an outer side with respect to an outer peripheral end of the front surface electrode in a surface layer of the semiconductor layer, the termination well region being a second conductivity type;
a field insulating film configured to cover at least a part of the termination well region, the field insulating film provided to extend to an outer peripheral side with respect to an outer peripheral end of the termination well region on a front surface of the semiconductor layer;
a resin layer provided to be in contact with a front surface of the semiconductor layer on an outer side with respect to an outer peripheral end of the field insulating film; and
a floating well region spaced apart from the termination well region in a surface layer of the semiconductor layer, the floating well region formed to be in contact with an outer peripheral end of the field insulating film to extend to an outer side with respect to an outer peripheral end of the field insulating film, the floating well region having a floating potential and being a second conductivity type.

Effects of the Invention

According to the semiconductor device of the present invention, it is possible to prevent precipitation of an oxide on a front surface portion of a semiconductor layer on an outer peripheral side with respect to a field insulating film to prevent peeling of a resin layer, whereby it is possible to provide a highly reliable semiconductor device.

The objects, characteristics, aspects, and advantages of the present invention will become more apparent from the following detailed description and the accompanying drawings.

BRIEF DESCRIPTION OF DRAWINGS

FIG. 1 is a cross-sectional view illustrating a semiconductor device according to a first embodiment of the present invention.
FIG. 5 is a cross-sectional view illustrating a semiconductor device according to the first embodiment of the present invention.
FIG. 6 is a cross-sectional view illustrating a semiconductor device according to the first embodiment of the present invention.

FIG. 11 is a cross-sectional view illustrating a semiconductor device according to a second embodiment of the present invention.

FIG. 12 is a cross-sectional view illustrating a semiconductor device according to the second embodiment of the present invention.

DESCRIPTION OF EMBODIMENTS

Figure 2:
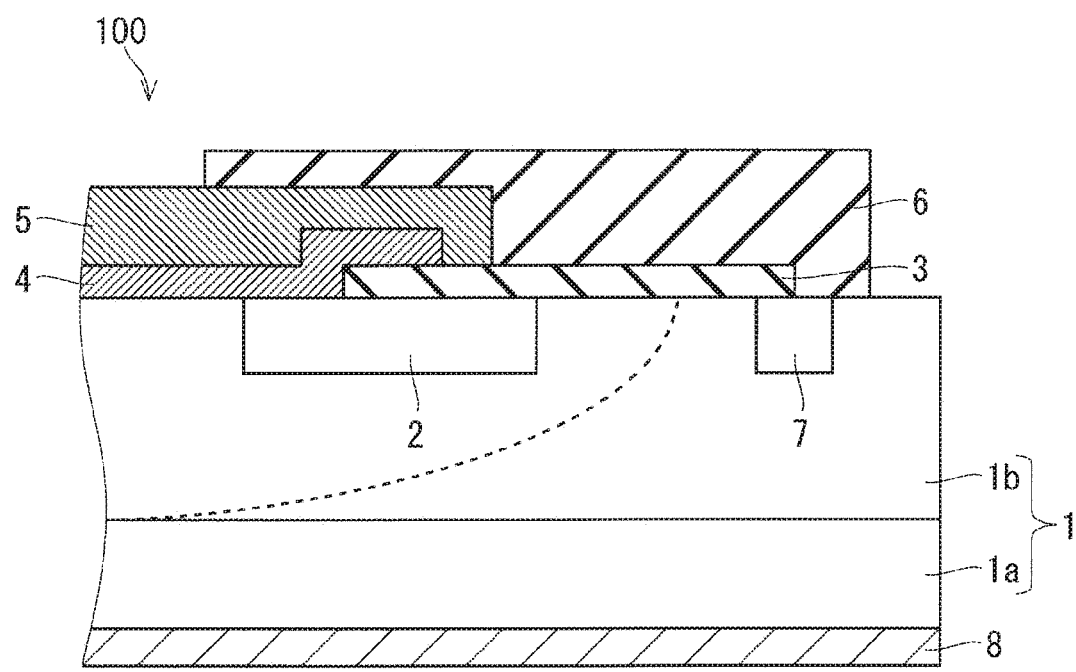
FIG. 2 is a cross-sectional view illustrating a semiconductor device according to the first embodiment of the present invention.

Hereinafter, embodiments will be described with reference to the accompanying drawings. It should be noted that the drawings are shown schematically, and the mutual relationship between the sizes and positions of the respective images shown in the different drawings is not necessarily described accurately and can be appropriately changed. In addition, in the following description, the same components are denoted by the same reference numerals to be illustrated, and their names and functions are also the same. Therefore, detailed description of the same components may be omitted. In addition, herein, the phrase "on something" or "covering something" does not prevent the presence of an interposed object between components. For example, when "B provided on A" or "A covers B" is described, both of a case in which another component C is provided between A and B and a case in which another component C is not provided between A and B are included. In addition, in the following description, terms that mean a specific position and direction such as "upper", "lower", "side", "bottom", "front", or "back" may be used, but these terms are used to facilitate understanding of the contents of the embodiments for the sake of convenience and are not related to the direction at the time of actual implementation.

First Embodiment

<Configuration>

First, a configuration of a termination portion of the semiconductor device 100 according to a first embodiment of the present invention will be described. The semiconductor device 100 is a Schottky barrier diode (SBD). Hereinafter, the SiC-SBD in which the semiconductor material is silicon carbide (SiC), the first conductivity type is n-type, and the second conductivity type is p-type will be exemplarily described, but the semiconductor material may be silicon (Si) or another wide band gap material, and the semiconductor device may be a semiconductor device in which the first conductivity type is p-type and the second conductivity type is n-type. In addition, the semiconductor device 100 does not have to be an SBD, and may be another diode such as a PN junction diode or a junction barrier Schottky (JBS) diode.

FIG. 1 is a cross-sectional view schematically illustrating the configuration of the termination portion of the semiconductor device 100 according to the first embodiment. In FIG. 1, the right side is the termination portion side and the left side is the active region side where the main current flows in the ON state of the semiconductor device 100. As illustrated in FIG. 1, the semiconductor device 100 includes: an n-type semiconductor substrate 1a, an n-type semiconductor layer 1b formed on the semiconductor substrate 1a; a field insulating film 3 formed on the semiconductor layer 1b with a central portion opened, a Schottky electrode 4 that is a first front surface electrode formed to climb on the field insulating film 3 from a central portion where the field insulating film 3 is not present on the semiconductor layer 1b; an electrode pad 5 that is a second front surface electrode formed on the Schottky electrode 4; a p-type termination well region 2 formed in a surface layer portion of the semiconductor layer 1b so as to extend to an outer peripheral side with respect to an outer peripheral end of the electrode pad 5; a front surface protective film 6 formed on the electrode pad 5 and field insulating film 3 so as to cover the outer peripheral end of the electrode pad 5 and an outer peripheral end of the field insulating film 3; a p-type floating well region 7 formed in the surface layer portion of the semiconductor layer 1b so as to extend to the outer peripheral side with respect to the outer peripheral end of the field insulating film 3; and a back surface electrode 8 formed on a back surface of the semiconductor substrate 1a. The termination well region 2 is formed in a ring shape from the inside of the outer peripheral end of the Schottky electrode 4 to the outer peripheral side with respect to the outer peripheral end of the electrode pad 5. The floating well region 7 is formed in a ring shape from the inside to the outer peripheral side of the outer peripheral end of the field insulating film 3. In addition, the floating well region 7 is formed so that the depletion layer extending from the pn junction does not extend to the front surface of the semiconductor layer 1b at the outer peripheral end of the field insulating film 3.

It should be noted that "floating" herein means that it is not connected to an electrode or the ground and having a floating potential.

The semiconductor substrate 1a and the semiconductor layer 1b are made of 4H-type silicon carbide semiconductor, and the semiconductor substrate 1a is a low resistance n-type substrate, and the semiconductor layer 1b has n-type impurities with an impurity concentration of $1 \times 10^{14}/cm^3$ to $1 \times 10^{17}/cm^3$. As the field insulating film 3, an inorganic insulating film such as silicon oxide ($SiO_2$) or silicon nitride (SiN) can be used, and in the present embodiment, silicon oxide with a thickness of 0.1 to 3 μm is used.

In addition, the Schottky electrode 4 that is the first front surface electrode only needs to be a metal that forms a Schottky junction with an n-type silicon carbide semiconductor and can use titanium, molybdenum, nickel, gold, tungsten or the like, and the thickness can be, for example, 30 nm to 300 nm. In the present embodiment, a titanium film having a thickness of 200 nm is used as the Schottky electrode 4.

Furthermore, as the electrode pad 5 that is the second front surface electrode, a metal containing any one of aluminum, copper, molybdenum, and nickel, an aluminum alloy such as Al—Si, or the like can be used, and the thickness can be, for example, 300 nm to 10 μm. In the present embodiment, an Al layer having a thickness of 5 μm is used as the electrode pad 5.

The front surface protective film 6 is made of an insulating material, and has an opening on the central portion of the electrode pad 5 so that the electrode pad 5 is connected to an external terminal. In order to reduce stress from the external environment, the front surface protective film 6 is desirably a resin film, and in the present embodiment, polyimide is used as the front surface protective film 6.

In addition, the back surface electrode 8 is in ohmic contact with the semiconductor substrate 1a. Therefore, for the back surface electrode 8, a metal such as nickel, aluminum, or molybdenum to be in ohmic contact with the n-type silicon carbide semiconductor that is the semiconductor substrate 1a can be used. Nickel is used in the present embodiment.

<Manufacturing Method>

Next, a method for manufacturing the semiconductor device 100 according to the first embodiment of the present invention will be described.

First, on a semiconductor substrate 1a of an n+-type low resistance silicon carbide semiconductor having an off angle, epitaxial crystal growth is performed on an n-type semiconductor layer 1b of silicon carbide having an impurity concentration of $1\times10^{14}/cm^3$ to $1\times10^{17}/cm^3$. Then, patterning the resist film into a predetermined shape by a photolithography process or the like and then ion implantation of p-type impurities such as Al and B from above the resist film forms a p-type termination well region 2 (guard ring region) in the surface layer portion in the semiconductor layer 1b.

The dose amount of the termination well region 2 is preferably $0.5\times10^{13}/cm^2$ to $5\times10^{13}/cm^2$. In the present embodiment, it is $2.0\times10^{13}/cm^2$. When Al is implanted, the implantation energy of p-type impurities is, for example, 100 keV to 700 keV. In such a case, when the dose amount [$cm^{-2}$] of the p-type impurities in each region described above is converted into the impurity concentration [$cm^{-3}$], the impurity concentration of the termination well region 2 is $1\times10^{17}/cm^3$ to $1\times10^{19}/cm^3$.

In addition, the floating well region 7 is also formed by patterning a resist film into a predetermined shape by a photolithography process or the like, and then ion-implanting p-type impurities such as Al and B from above the resist film.

The impurity concentration and the formation depth of the floating well region 7 are set so that a depletion layer extending from the pn junction portion formed at the interface between the floating well region 7 and the semiconductor layer 1b do not extend to the front surface of the semiconductor layer 1b at the outer peripheral end of the field insulating film 3.

When the pn junction is formed such that the floating well region 7 and the semiconductor layer 1b form a step junction, a depletion layer width W [cm] extending from the pn junction is represented by the following formula (1).

[Mathematical Formula 1]

$$W = x_p + x_n = \sqrt{\frac{2\varepsilon_s}{q}\left(\frac{N_a + N_d}{N_a N_d}\right)V_{bi}} \quad (1)$$

where, $x_p$ [cm] is a depletion layer width extending from the pn junction portion toward the inside of the floating well region 7, $x_n$ [cm] is a depletion layer width extending from the pn junction portion toward the semiconductor layer 1b, $\varepsilon_s$ is the relative permittivity of the semiconductor material, q [C] is the elementary charge, Na [$Cm^{-3}$] is the impurity concentration of the floating well region 7, $N_d$ [$cm^{-3}$] is the impurity concentration of the semiconductor layer 1b, and $V_{bi}$ [V] is a built-in potential.

Here, as shown in formula (2),

[Mathematical Formula 2]

$$x_p N_a = x_n N_d \quad (2)$$

since the relation of formula (2) holds, the depletion layer widths ($x_p$, $x_n$) extending from the pn junction portion to the floating well region 7 and the semiconductor layer 1b are represented as shown in formula (3).

[Mathematical Formula 3]

$$x_p = \sqrt{\frac{2\varepsilon_s}{q}\frac{N_d}{N_a(N_a+N_d)}V_{bi}}, \; x_n = \sqrt{\frac{2\varepsilon_s}{q}\frac{N_a}{N_d(N_a+N_d)}V_{bi}} \quad (3)$$

From formula (3), it can be seen that the depletion layer width $x_p$ extending from the pn junction portion toward the inside of the floating well region 7 increases as an impurity concentration $N_a$ of the floating well region 7 decreases.

When a silicon carbide semiconductor is used as a semiconductor material, $V_{bi}$ is about 2 volts. In addition, the floating well region 7 is connected to neither the front surface electrode nor the back surface electrode and is in an electrically floating state, and the potential difference in the vicinity of the floating well region 7 hardly changes even when a voltage is applied to the semiconductor device. Therefore, the depletion layer width $x_p$ is substantially constant regardless of the magnitude of the voltage applied to the semiconductor device. Therefore, in order to prevent depletion of the front surface of the floating well region 7, the impurity concentration $N_a$ and a formation depth L of the floating well region 7 only need to be adjusted so that the formation depth of the floating well region 7 (that is, the distance from the front surface of the floating well region 7 to the pn junction portion) L is larger than $x_p$ in formula (3), that is, L>$x_p$.

In the present embodiment, the dose amount of the floating well region 7 is $2.0\times10^{13}/cm^2$ that is the same as that of the termination well region 2. In this case, the termination well region 2 and the floating well region 7 can be simultaneously formed by resist patterning.

It should be noted that the depletion layer inside the floating well region 7 can also extend from the inner peripheral direction and the outer peripheral direction of the floating well region 7. Therefore, the floating well region 7 is preferably formed such that each of the inner peripheral end and outer peripheral end of the floating well region 7 is separated from the outer peripheral end of the field insulating film 3 by more than the value of $x_p$. For example, the floating well region 7 is preferably formed such that the inner peripheral end of the floating well region 7 is positioned on the inner peripheral side with respect to the outer peripheral end of the field insulating film 3 by 1 μm or more and the outer peripheral end of the floating well region 7 is positioned on the outer peripheral side with respect to the outer peripheral end of the field insulating film 3 by 1 μm or more.

Forming the termination well region 2 and the floating well region 7 in this manner and then annealing them at a high temperature of 1500° C. or more activates the p-type termination well region 2 and the floating well region 7.

Next, depositing a silicon oxide film having a thickness of 1 μm on the front surface of the semiconductor layer 1b by, for example, CVD method and then removing the silicon oxide film at the central portion of the semiconductor layer 1b by a photolithography process and etching forms a field insulating film 3 having an opening. The opening end of the field insulating film 3 is formed to be positioned on the termination well region 2. Subsequently, the back surface electrode 8 is formed on the back surface of the semiconductor substrate 1*a* by sputtering or the like.

Next, a metal film to be a Schottky electrode 4 is formed on the entire front surface of the semiconductor layer 1*b* on which the field insulating film 3 is formed, for example, by sputtering, and a Schottky electrode 4 having a desired shape is formed by a photolithography process and etching. Although dry etching or wet etching can be used to etch the metal film, it is desirable to use wet etching to reduce the influence on the characteristics of the semiconductor device, and for example, hydrofluoric acid (HF) is used as an etching solution.

Subsequently, an electrode pad 5 is formed on the field insulating film 3 and the Schottky electrode 4 so as to cover the Schottky electrode 4. The formation of the electrode pad 5 is performed by the photolithography process and the etching similar to the formation of the Schottky electrode 4. The etching film of the metal film is performed by wet etching using, for example, a phosphoric acid-based etching solution.

Next, a front surface protective film 6 is formed to cover the electrode pad 5. The front surface protective film 6 is formed into a desired shape, for example, by applying and exposing a photosensitive polyimide.

It should be noted that the formation of the back surface electrode 8 may be performed after all the processes on the front surface side of the semiconductor substrate 1 are completed.

<Operation>

Next, the operation of the SiC-SBD that is the semiconductor device 100 of the present embodiment will be described with reference to FIG. 2.

In the SiC-SBD of the present embodiment, when a negative voltage is applied to the back surface electrode 8 with respect to the front surface electrode (the Schottky electrode 4 and the electrode pad 5), a current flows from the front surface electrode to the back surface electrode 8, and the semiconductor device 100 is brought into a conduction state (ON state). Conversely, when a positive voltage is applied to the back surface electrode 8 with respect to the front electrode (reversely biased), the semiconductor device 100 is brought into a blocking state (OFF state).

When the semiconductor device 100 is brought into the OFF state, a large electric field is applied to the front surface of the active region of the semiconductor layer 1*b* or in the vicinity of the pn junction interface between the semiconductor layer 1*b* and the termination well region 2, and when a voltage exceeding a critical electric field is applied to the back surface electrode 8, avalanche breakdown occurs. Normally, the semiconductor device 100 is used in a range where avalanche breakdown does not occur, and rated voltage V [V] is determined.

When the semiconductor device 100 is brought into the OFF state, as illustrated in FIG. 2, a depletion layer extends in the direction of the semiconductor substrate 1*a* and the outer peripheral direction of the semiconductor layer 1*b* from the front surface of the active region of the semiconductor layer 1*b* and the pn junction interface between the semiconductor layer 1*b* and the termination well region 2. Here, the position indicated by the dotted line is the tip position of the depletion layer. At this time, in the depleted region at the interface between the semiconductor layer 1*b* and the field insulating film 3, a potential difference is generated from the outer peripheral side to the inner peripheral side of the semiconductor layer 1*b*.

Here, a case where the semiconductor device is brought into the OFF state in a high humidity state is considered. The high water-absorbability of the front surface protective film 6 and the potential difference generated in the OFF state causes the inside of the front surface protective film 6 to be in a state in which ions are generated by the electrolysis of water. On the other hand, when a moisture layer stagnates on the front surface of the field insulating film 3 having low water-absorbability as compared with that of the front surface protective film 6, the front surface of the field insulating film 3 becomes a low resistance layer, and functions like a field plate when connected to the electrode pad 5. At this time, the depletion layer formed inside the semiconductor layer 1*b* further extends to the outer periphery.

Figure 3:
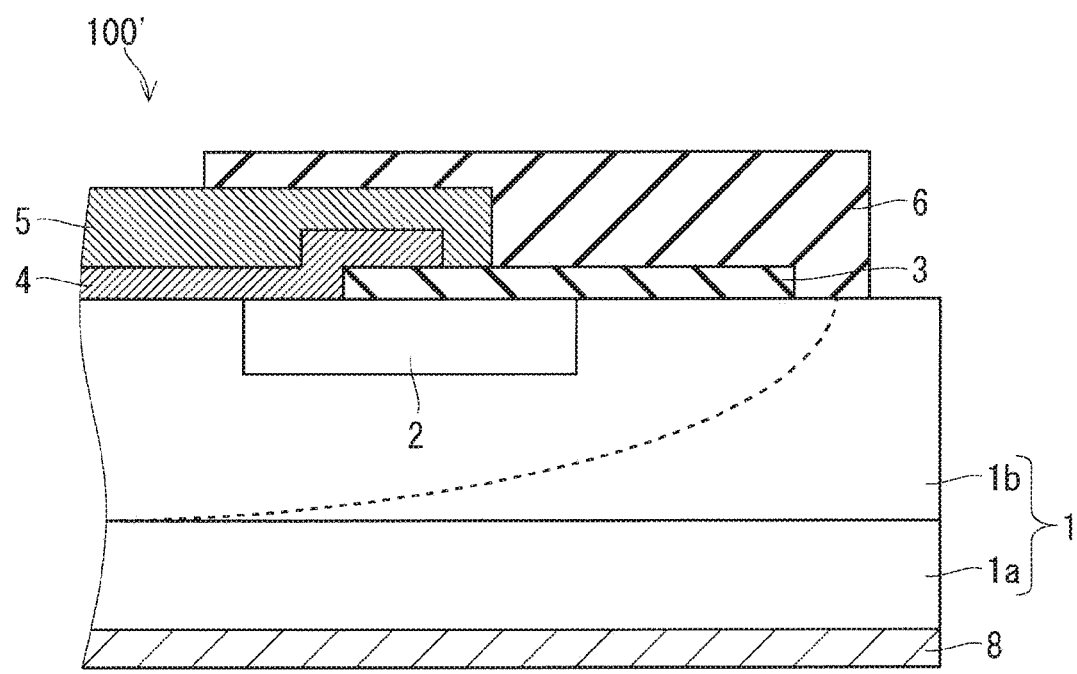
FIG. 3 is a cross-sectional view illustrating a semiconductor device according to the prior art.

FIG. 3 illustrates a cross-sectional view in the case where the depletion layer extends to the outer periphery of the field insulating film 3 in the OFF state in a semiconductor device 100' in the case where the floating well region 7 is not provided. At this time, at the interface between the semiconductor layer 1*b* and the front surface protective film 6, a potential difference is generated in the direction horizontal to the interface, and moisture is decomposed into hydrogen ions and hydroxide ions. In addition, when a material containing Si is used for the positive electrode and reacted with hydroxide ions, silicon oxide ($SiO_2$) is generated. Therefore, $SiO_2$ precipitates at the interface between the semiconductor layer 1*b* on the outer periphery of the field insulating film 3 and the front surface protective film 6 of the semiconductor device 100'.

The $SiO_2$ thus precipitated pushes up the front surface protective film 6, and in particular, when $SiO_2$ is precipitated at a position close to the field insulating film 3, peeling occurs between the field insulating film 3 and the front surface protective film 6 to form a cavity. At this time, element defect is caused by a leak due to moisture entering the cavity and discharge occurring in the cavity.

In the configuration of the present embodiment, the floating well region 7 is formed in the surface layer portion of the semiconductor layer 1*b* so as to extend from the inside of the outer peripheral end of the field insulating film 3 to the outer peripheral side with respect to the outer peripheral end. In addition, the p-type impurity concentration and the depth of the floating well region 7 are set such that the depletion layer extending inside the floating well region 7 does not reach the front surface of the semiconductor layer 1*b* at the outer peripheral end of the field insulating film 3. In this case, since no potential difference is generated at the interface between the semiconductor layer 1*b* and the front surface protective film 6 at the outer peripheral end of the field insulating film 3, there is no supply of hydroxide ions near the outer peripheral end of the field insulating film 3, and $SiO_2$ does not precipitate. Therefore, it is possible to reduce an element defect due to the peeling of the field insulating film 3 and the front surface protective film 6.

Figure 4:
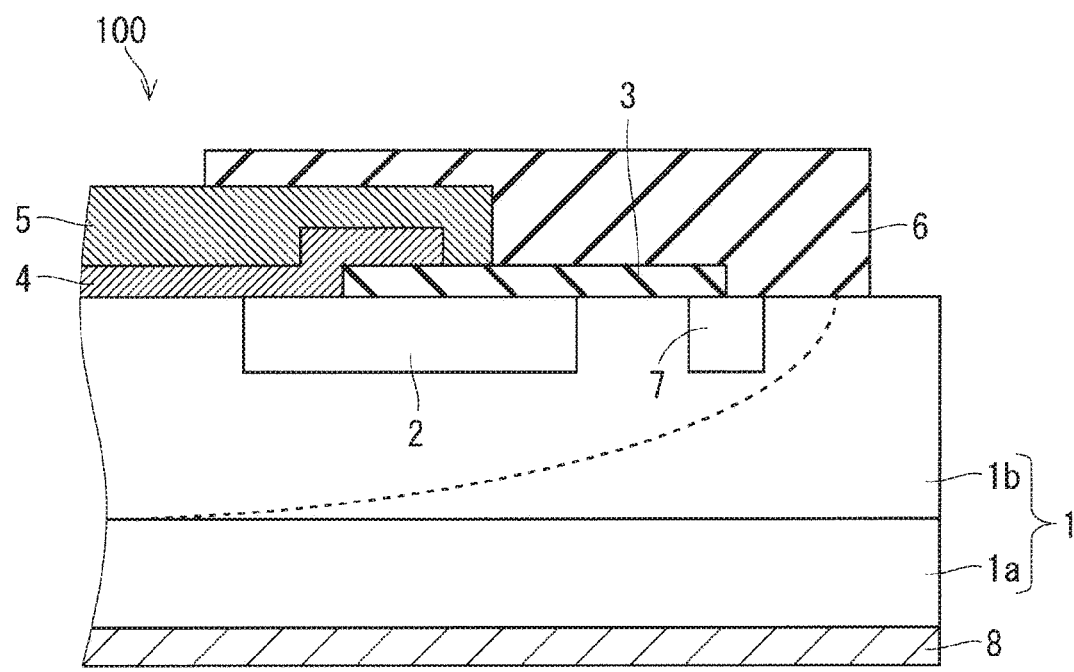
FIG. 4 is a cross-sectional view illustrating a semiconductor device according to the first embodiment of the present invention.

In addition, when the impurity concentration of the termination well region 2 is large, or when the distance between the termination well region 2 and the floating well region 7 is short, as illustrated in FIG. 4, a depletion layer extending from the pn junction interface between the semiconductor layer 1*b* and the termination well region 2 may extend beyond the floating well region 7 further to the outer peripheral side. In this case, since no potential difference is generated at the interface between the semiconductor layer 1*b* and the front surface protective film 6 at the outer peripheral end of the field insulating film 3, there is no supply of hydroxide ions near the outer peripheral end of the field insulating film 3, and $SiO_2$ does not precipitate. However, a potential difference may occur at the interface between the semiconductor layer 1b and the front surface protective film 6 on the outer peripheral side of the floating well region 7, and $SiO_2$ may be precipitated by the supply of hydroxide ions. In this case, since the precipitation of $SiO_2$ is at a position away from the outer peripheral end of the field insulating film 3, peeling between the field insulating film 3 and the front surface protective film 6 can be prevented.

Here, the maximum width $W_1$ [cm] of the depletion layer extending from the pn junction interface between the semiconductor layer 1b and the termination well region 2 toward the semiconductor layer 1b is represented by the following formula (4).

[Mathematical Formula 4]

$$W_1 = \sqrt{\frac{2\varepsilon_0 \varepsilon_s V_{bd}}{q N_d}} \quad (4)$$

$\varepsilon_0$ [F/m] is a dielectric constant of vacuum, and $V_{bd}$ [V] is an avalanche voltage of the semiconductor device 100. In the case where silicon carbide is used for the semiconductor substrate 1a and the semiconductor layer 1b, the impurity concentration $N_d$ of the semiconductor layer 1b is larger and the width $W_1$ of the depletion layer is smaller as compared to the case where silicon is used. Therefore, in the case where silicon carbide is used for the semiconductor substrate 1a and the semiconductor layer 1b, there is an advantage that the dimensions of the outer peripheral region can be reduced and the cost of the semiconductor device can be reduced as compared with the case where silicon is used. On the other hand, when the distance between the outer peripheral end of the termination well region 2 and the outer peripheral end of the field insulating film 3 is smaller than the width $W_1$ of the depletion layer, in the semiconductor device 100' without the floating well region 7, when the semiconductor device 100' is bought into the OFF state in a high humidity state, a potential difference occurs at the outer peripheral end of the field insulating film 3 to precipitate $SiO_2$ on the front surface of the semiconductor layer 1b. On the other hand, according to the semiconductor device 100 of the present embodiment including the floating well region 7, there can be obtained the effect of preventing the precipitation of $SiO_2$ on the front surface of the semiconductor layer 1b in contact with the outer peripheral end of the field insulating film 3 and preventing an element defect due to the peeling between the field insulating film 3 and the front surface protective film 6.

In addition, when silicon is used for the semiconductor substrate 1a and the semiconductor layer 1b, in order to prevent the width $W_1$ of the depletion layer from largely extending to the outer periphery of the termination well region 2, a structure may be adopted in which a field plate electrode is provided on the front surface of the semiconductor layer 1b on the outer peripheral side of the field insulating film 3 and the field plate electrode climbs on the field insulating film 3. In addition, in order to electrically connect the field plate electrode and the semiconductor layer 1b, in some cases, a p+ injection layer is provided in the surface layer of the semiconductor layer 1b on the outer peripheral side of the field insulating film 3 and connected to the field plate electrode. In such a structure, when the semiconductor device is brought into the OFF state in a high humidity state, the field plate electrode may be corroded and the front surface protective film 6 may be peeled off.

However, since the semiconductor device 100 according to the first embodiment does not include the field plate electrode, the element defect due to the peeling between the field plate electrode and the front surface protective film 6 does not occur.

In addition, as illustrated in FIG. 5, when a plurality of termination well regions 2 are formed so as to be separated from each other from the inner peripheral side toward the outer peripheral side, a potential distribution is formed between the plurality of termination well regions 2, and it is possible to prevent the depletion layer from excessively extending on the outer peripheral side of the termination well region 2. In this case, the depletion layer extending from the pn junction interface between the semiconductor layer 1b and the termination well region 2 can be prevented from reaching the floating well region 7, and the precipitation of $SiO_2$ on the outer periphery of the field insulating film 3 can be further prevented.

In addition, as illustrated in FIG. 6, when the termination well region 2 is formed so that the impurity concentration decreases toward the outer periphery (in FIG. 6, termination well regions 2' and 2" with lower impurity concentration are formed in a part of the termination well region 2), a depletion layer easily extends from the pn junction interface between the semiconductor layer 1b and the termination well region 2 also to the inside of the termination well region 2, a potential distribution is formed inside the termination well region 2, and it is possible to prevent the depletion layer from excessively extending to the outer peripheral side of the termination well region 2. In this case, the depletion layer extending from the pn junction interface between the semiconductor layer 1b and the termination well region 2 can be prevented from reaching the floating well region 7, and the precipitation of $SiO_2$ on the outer periphery of the field insulating film 3 can be further prevented.

Figure 7:
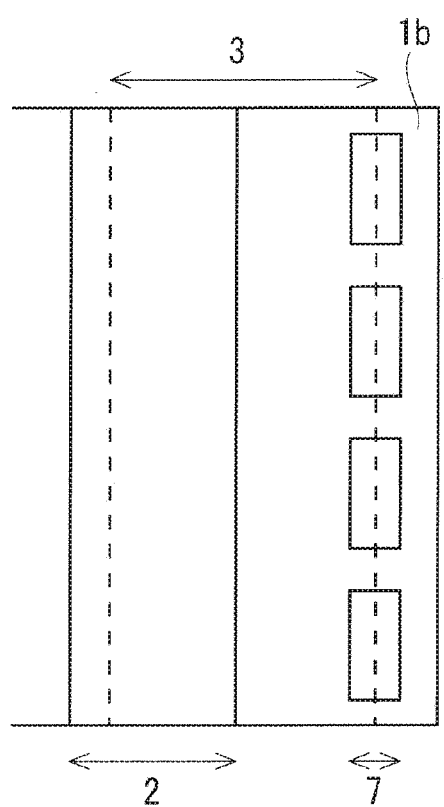
FIG. 7 is a plan view illustrating a semiconductor device according to the first embodiment of the present invention.

In addition, FIG. 7 is a plan view illustrating a modification of the present embodiment. As illustrated in FIG. 7, the floating well region 7 may include at least one or more portions separated in the peripheral direction in a plan view. In this case, even when the depletion layer extending from the pn junction interface between the semiconductor layer 1b and the termination well region 2 reaches the floating well region 7, since the floating well regions 7 are thinned, the depletion layer is less likely to extend on the outer peripheral side of the floating well region 7. Therefore, a potential difference is less likely to occur on the front surface of the semiconductor layer 1b on the outer peripheral side of the floating well region 7, the precipitation of $SiO_2$ can be prevented, and the peeling between the field insulating film 3 and the front surface protective film 6 can be prevented.

Figure 8:
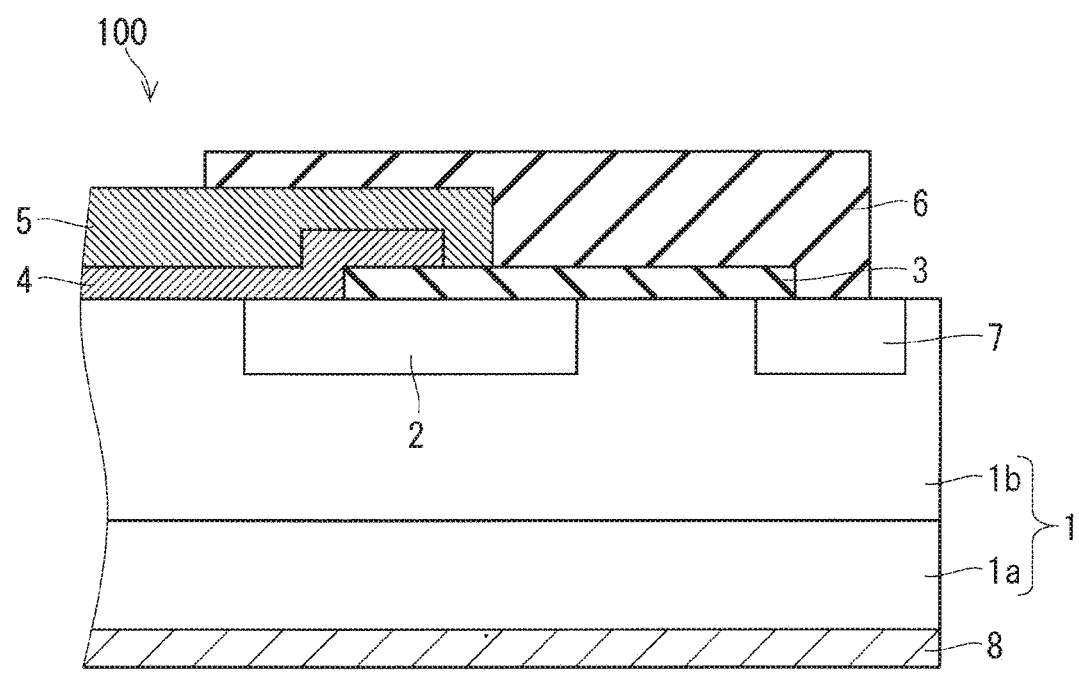
FIG. 8 is a cross-sectional view illustrating a semiconductor device according to the first embodiment of the present invention.
Figure 9:
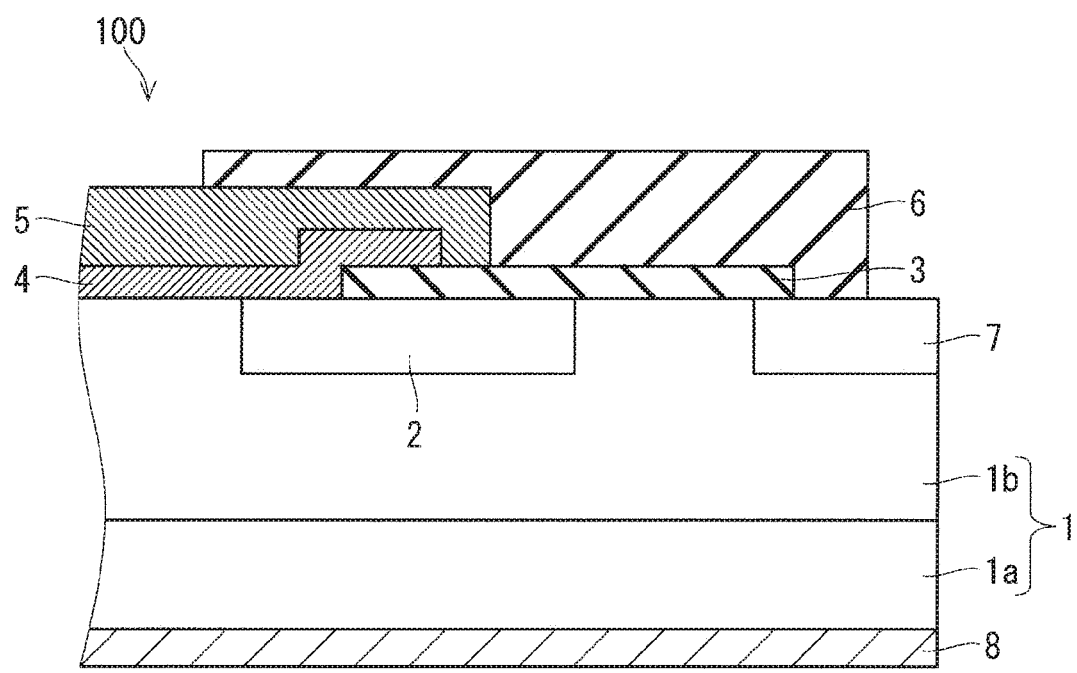
FIG. 9 is a cross-sectional view illustrating a semiconductor device according to the first embodiment of the present invention.

In addition, as illustrated in FIG. 8, when the front surface protective film 6 extends to the outer peripheral side of the outer peripheral end of the field insulating film 3, it is preferable to form the floating well region 7 to extend to the outer peripheral side of the outer peripheral end of the front surface protective film 6, and to extend the region where the front surface is not depleted to the outer peripheral side of the outer peripheral end of the front surface protective film 6. In addition, as illustrated in FIG. 9, the floating well region 7 and the region where the front surface is not depleted may be formed to extend to the outer peripheral end of the semiconductor layer 1b. At this time, since no potential difference occurs at the interface between the semiconductor layer 1b and the front surface protective film 6, $SiO_2$ does not precipitate in the region where the semiconductor layer 1b is in contact with the front surface protective film 6, and the peeling between the field insulating film 3 and the front surface protective film 6 can be prevented.

Figure 10:
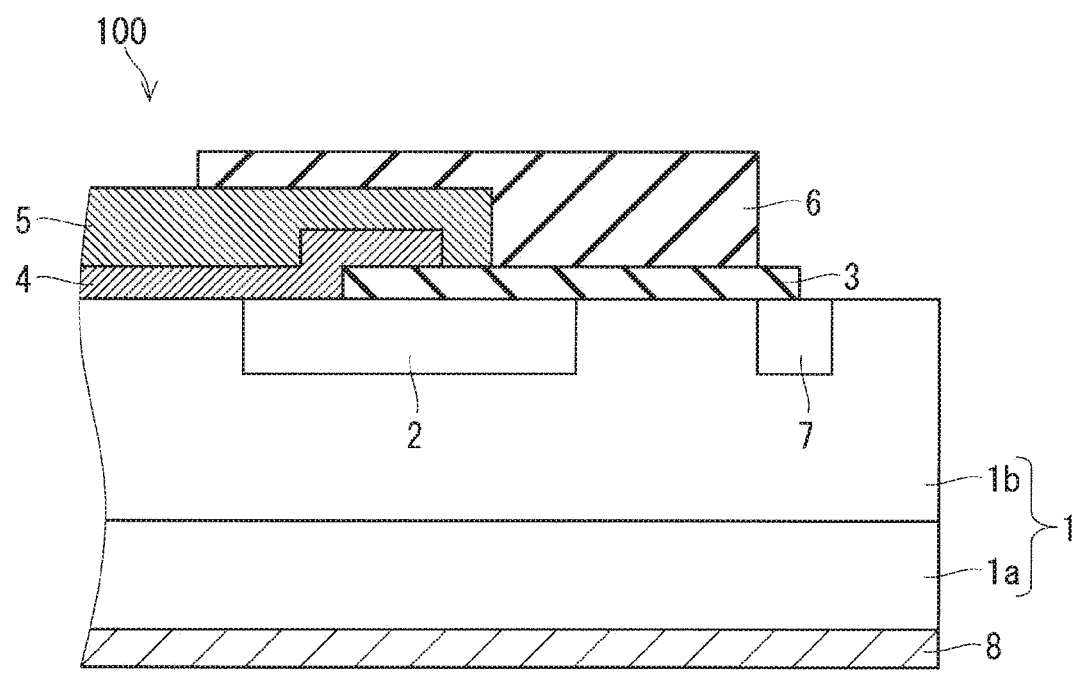
FIG. 10 is a cross-sectional view illustrating a semiconductor device according to the first embodiment of the present invention.

In addition, there is considered a case where, as illustrated in FIG. 10, the outer peripheral end of the front surface protective film 6 is formed to be positioned on the inner side of the outer peripheral end of the field insulating film 3, and furthermore, the entire semiconductor device 100 is sealed by a sealing gel (not shown). In this case, the front surface protective film 6 is not in contact with the front surface of the semiconductor layer 1b on the outer peripheral side of the field insulating film 3, but the sealing gel is in contact with the front surface. Also in this case, providing the floating well region 7 can prevent the precipitation of $SiO_2$ at the interface between the front surface of the semiconductor layer 1b and the sealing gel and can prevent the peeling of the sealing gel. In addition, since the material used for the sealing gel is softer than the material such as polyimide generally used for the front surface protective film 6, the peeling of the sealing gel is relatively less likely to occur even when $SiO_2$ precipitates.

<Effect>

As described above, according to the semiconductor device 100 of the present embodiment, the precipitation of $SiO_2$ at the outer peripheral end of the field insulating film 3 can be prevented, and the peeling between the field insulating film 3 and the front surface protective film 6 can be prevented.

Second Embodiment

<Configuration>

Subsequently, a configuration of a semiconductor device 200 according to a second embodiment of the present invention will be described. The semiconductor device 200 of the second embodiment is a metal oxide semiconductor field effect transistor (MOSFET). Hereinafter, the SiC-MOSFET in which the semiconductor material is silicon carbide (SiC), the first conductivity type is n-type, and the second conductivity type is p-type will be exemplarily described, but the semiconductor material may be silicon (Si) or another wide band gap material, and the semiconductor device may be a semiconductor device in which the first conductivity type is p-type and the second conductivity type is n-type. In addition, another transistor such as a junction FET (JFET) or an insulated gate bipolar transistor (IGBT) may be used instead of the MOSFET. In addition, not only a planar type but a trench type may be used.

FIG. 11 is a cross-sectional view schematically illustrating a configuration of a termination portion of the semiconductor device 200 according to the second embodiment. In FIG. 11, the right side is the termination portion side and the left side is the active region side of the semiconductor device 200. As illustrated in FIG. 11, the semiconductor device 200 includes an n-type semiconductor substrate 1a, an n-type semiconductor layer 1b formed on the semiconductor substrate 1a, a field insulating film 3 formed on the semiconductor layer 1b with a central portion opened, and an electrode pad 5 that is a front surface electrode. The active region of the semiconductor device 200 has a structure in which a plurality of unit cells illustrated in FIG. 12 are repeated. As illustrated in FIG. 12, each unit cell has a configuration including a p-type well region 9 in the surface layer of the n-type semiconductor layer 1b, a high concentration p region 10 having an impurity concentration higher than that of the p-type well region 9 in the surface layer of the p-type well region 9, the high concentration p region 10 in ohmic contact with the electrode pad 5, an n-type source 11 in contact with the electrode pad 5 in the surface layer of the p-type well region 9 to sandwich the high concentration p region 10, a gate insulating film 12 across the front surfaces of the semiconductor layer 1b, the p-type well region 9, and the n-type source 11, a gate electrode 13 adjacent to a part or all of the front surface of the gate insulating film 12, and an interlayer insulating film 14 for covering the gate insulating film 12 and the gate electrode 13 so that the electrode pad 5 and the gate electrode 13 are not in contact with each other. The termination region on the outer periphery of the active region of the semiconductor device 200 includes a high concentration p region 10 in ohmic contact with the electrode pad 5 in the surface layer of the p-type well region 9' formed to surround the active region, and furthermore, a gate electrode 13 on a part of the front surface of the p-type well region 9' via the gate insulating film 12.

The gate electrode 13 of each unit cell is connected at the outer periphery of the active region, and is covered with the interlayer insulating film 14 so as not to be in contact with the electrode pad 5. A part of the interlayer insulating film 14 is opened at the outer periphery of the active region, and the electrode pad 5 formed to be partly separated is connected to the gate electrode 13. At the further outer periphery of the p-type well region 9' at the outer periphery of the active region, a p-type termination well region 2 is provided in connection with the p-type well region 9', and a field insulating film 3 is formed on the front surface of the semiconductor layer 1b so as to cover the termination well region 2. Furthermore, a front surface protective film 6 formed on the electrode pad 5 and the field insulating film 3 so as to cover a part of the electrode pad 5 and the outer peripheral end of the field insulating film 3, a p-type floating well region 7 formed in the surface layer portion of the semiconductor layer 1b so as to extend on the outer peripheral side of the outer peripheral end of the field insulating film 3, and a back surface electrode 8 formed on the back surface of the semiconductor substrate 1a are provided. The floating well region 7 is formed in a ring shape from the inside of the outer peripheral end of the field insulating film 3 to the outer peripheral side of the outer peripheral end. In addition, the floating well region 7 is formed so that the depletion layer extending from the pn junction does not extend to the front surface of the semiconductor layer 1b at the outer peripheral end of the field insulating film 3.

Similar to the semiconductor device 100 described in the first embodiment, the arrangement of the termination well region 2, the floating well region 7, the field insulating film 3, and the front surface protective film 6 may have a structure having the relationship similar to that in FIG. 5, FIG. 6, FIG. 7, FIG. 8, FIG. 9, and FIG. 10.

<Manufacturing Method>

Subsequently, a method for manufacturing the semiconductor device 200 according to the present embodiment will be described.

First, on a semiconductor substrate 1a of an n+-type low resistance silicon carbide semiconductor having an off angle, epitaxial crystal growth is performed on an n-type semiconductor layer 1b of silicon carbide having an impurity concentration of $1\times10^{14}/cm^3$ to $1\times10^{17}/cm^3$. Then, patterning the resist film into a predetermined shape by a photolithography process or the like and then repeating ion implantation of impurities from above the resist film forms, in the surface layer portion in the semiconductor layer 1b, the p-type well region 9 of the active region and the p-type well region 9' on the outer periphery of the active region, the high concentration p region 10, the n-type source 11, the termination well region 2, and the floating well region 7.

In ion implantation, N or the like is used as the ion species of the n-type semiconductor, and Al, B, or the like is used as the ion species of the p-type semiconductor. Here, the impurity concentration of the p-type well region 9 is in the range of $1.0\times10^{18}$ cm$^{-3}$ to $1.0\times10^{20}$ cm$^{-3}$, and the impurity concentration of the high concentration p region 10 and the n-type source 11 is in a range larger than the impurity concentration of the p-type well region 9. In addition, the dose amount of the termination well region 2 is preferably $0.5\times10^{13}$/cm$^2$ to $5\times10^{13}$/cm$^2$. In the present embodiment, it is $2.0\times10^{13}$/cm$^2$. When Al is implanted, the implantation energy of p-type impurities is, for example, 100 keV to 700 keV. In such a case, when the dose amount [cm$^{-2}$] of the p-type impurities in each region described above is converted into the impurity concentration [cm$^{-3}$], the impurity concentration of the termination well region 2 is $1\times10^{17}$/cm$^3$ to $1\times10^{19}$/cm$^3$.

Similar to the first embodiment, the impurity concentration $N_a$ and the depth L of the floating well region 7 are set so that a depletion layer extending from the pn junction portion formed at the interface between the floating well region 7 and the semiconductor layer 1b do not extend to the front surface of the semiconductor layer 1b at the outer peripheral end of the field insulating film 3. That is, the impurity concentration $N_a$ and the formation depth L of the floating well region 7 only need to be adjusted so that the depth L of the floating well region 7 becomes larger than $x_p$ in formula (3). Here, the dose amount of the floating well region 7 is $2.0\times10^{13}$/cm$^2$ that is the same as that of the termination well region 2. In other words, the termination well region 2 and the floating well region 7 can be simultaneously formed by resist patterning. In addition, the floating well region 7 may be made to have a higher concentration, or may be formed simultaneously with the p-type well region 9 or the high concentration p region 10.

In addition, since a depletion layer inside the floating well region 7 may also extend from the inner peripheral direction and the outer peripheral direction of the floating well region 7, each of the inner peripheral end and the outer peripheral end of the floating well region 7 is preferably formed so as to be separated from the outer peripheral end of the field insulating film 3 by more than the value of $x_p$. For example, the floating well region 7 is preferably formed such that the inner peripheral end of the floating well region 7 is positioned on the inner peripheral side with respect to the outer peripheral end of the field insulating film 3 by 1 μm or more and the outer peripheral end of the floating well region 7 is positioned on the outer peripheral side with respect to the outer peripheral end of the field insulating film 3 by 1 μm or more.

Forming the p-type well region 9, the high concentration p region 10, the n-type source 11, the termination well region 2, and the floating well region 7 in this manner and then annealing them at a high temperature of 1500° C. or more activates the p-type well region 9, the high concentration p region 10, the n-type source 11, the termination well region 2, and the floating well region 7.

Subsequently, a field insulating film 3 made of a silicon dioxide film having a thickness of about 0.5 μm to 2 μm is formed by a CVD method, a photolithography process, or the like. At this time, for example, after the field insulating film 3 is formed on the entire surface, the field insulating film 3 only needs to be removed by a photolithography process, etching, or the like.

Subsequently, the front surface of the semiconductor layer 1b not covered with the field insulating film 3 is thermally oxidized and silicon oxide that is a gate insulating film 12 having a desired thickness is formed. Next, forming a conductive polycrystalline silicon film on the gate insulating film 12 by a low pressure CVD method and patterning the conductive polycrystalline silicon film forms a gate electrode 13. Subsequently, the interlayer insulating film 14 is formed by the low pressure CVD method. Subsequently, a contact hole penetrating the interlayer insulating film 14 and the gate insulating film 12 to reach the high concentration p region 10 and the n-type source 11 of the unit cell is formed, and at the same time, a contact hole in which the gate electrode 13 is in contact with the electrode pad 5 at the outer periphery of the active region is formed.

Furthermore, forming the electrode pad 5 and the back surface electrode 8 by a sputtering method, a deposition method, or the like completes the semiconductor device 200 having the cross-sectional view illustrated in FIG. 11. At this time, one or more of metals such as Ni, Ti, and Al is used for the electrode pad 5 and one or more of metals such as Ni and Au is used for the back surface electrode 8. In addition, the electrode pad 5 and the back surface electrode 8 are partially reacted with silicon carbide by heat treatment to form silicide.

<Operation>

Next, the operation of the semiconductor device 200 in the present embodiment will be described in two states.

A first state is when a positive voltage not less than the threshold value is applied to the gate electrode 13, and is referred to as "ON state". In the ON state, an inversion channel is formed in the channel region and a path, in which electrons that are carriers flow, is formed between the n-type source 11 and the semiconductor layer 1b. Therefore, applying a high voltage to the back surface electrode 8 with respect to the electrode pad 5 allows a current to flow through the semiconductor substrate 1a and the semiconductor layer 1b. At this time, a voltage applied between the electrode pad 5 and the back surface electrode 8 is referred to as an ON voltage, and the flowing current is referred to as an ON current. The ON current flows only in the active region where the channel is present, and does not flow in the termination region on the periphery of the active region.

A second state when a voltage not more than the threshold voltage is applied to the gate electrode 13, and is hereinafter referred to as "OFF state". In the OFF state, since no reverse carrier is formed in the channel region, no ON current flows, and a high voltage applied in the ON state is applied between the electrode pad 5 and the back surface electrode 8 of the MOSFET. At this time, since the voltage of the gate electrode 13 is approximately equal to the voltage of the electrode pad 5, a high voltage is also applied between the gate electrode 13 and the back surface electrode 8.

A high voltage is applied between the electrode pad 5 and gate electrode 13 and the back surface electrode 8 also in the termination region on the outer periphery of the active region illustrated in FIG. 11, but since electrical contact with the electrode pad 5 is formed in the p-type well region 9' of the termination region similar to electrical contact with the electrode pad 5 being formed in the p-type well region 9 in the active region, high electric field intensity is prevented from being applied between the gate insulating film 12 and the interlayer insulating film 14.

In the termination region on the outer periphery of the active region illustrated in FIG. 11, the semiconductor device 200 operates in the same manner as in the OFF state of the semiconductor device 100 of the first embodiment.

That is, a large electric field is applied to the vicinity of the pn junction interface between the semiconductor layer 1b and the termination well region 2, and when a voltage exceeding the critical electric field is applied to the back surface electrode 8, avalanche breakdown occurs. Normally, the semiconductor device 100 is used in a range where avalanche breakdown does not occur, and rated voltage V [V] is determined.

When the semiconductor device 200 is brought into the OFF state, a depletion layer extends in the direction of the semiconductor substrate 1a and the outer peripheral direction of the semiconductor layer 1b from the pn junction interface between the semiconductor layer 1b and the p-type well regions 9 and 9' and the pn junction interface between the semiconductor layer 1b and the termination well region 2.

Here, a case where the semiconductor device is brought into the OFF state in a high humidity state is considered. The high water-absorbability of the front surface protective film 6 and the potential difference generated in the OFF state causes the inside of the front surface protective film 6 to be in a state in which ions are generated by the electrolysis of water. On the other hand, when a moisture layer stagnates on the front surface of the interlayer insulating film 14 and the field insulating film 3 having low water-absorbability as compared with that of the front surface protective film 6, the front surface of the interlayer insulating film 14 and the field insulating film 3 becomes a low resistance layer, and functions like a field plate when connected to the electrode pad 5. At this time, the depletion layer formed inside the semiconductor layer 1b further extends to the outer periphery.

When the floating well region 7 is not provided, at the interface between the semiconductor layer 1b and the front surface protective film 6, a potential difference is generated in the direction horizontal to the interface, and moisture is decomposed into hydrogen ions and hydroxide ions. In addition, when a material containing Si is used for the positive electrode and reacted with hydroxide ions, silicon oxide ($SiO_2$) is generated. Therefore, $SiO_2$ precipitates at the interface between the semiconductor layer 1b on the outer periphery of the field insulating film 3 and the front surface protective film 6 of the semiconductor device 100'.

The $SiO_2$ thus precipitated pushes up the front surface protective film 6, and in particular, when $SiO_2$ is precipitated at a position close to the field insulating film 3, peeling occurs between the field insulating film 3 and the front surface protective film 6 to form a cavity. At this time, element defect is caused by a leak due to moisture entering the cavity and discharge occurring in the cavity.

Also in the configuration of the present embodiment, similar to the first embodiment, the floating well region 7 is formed in the surface layer portion of the semiconductor layer 1b so as to extend from the inside of the outer peripheral end of the field insulating film 3 to the outer peripheral side with respect to the outer peripheral end. In addition, the p-type impurity concentration and the depth of the floating well region 7 are set such that the depletion layer extending inside the floating well region 7 does not reach the front surface of the semiconductor layer 1b at the outer peripheral end of the field insulating film 3. In this case, since no potential difference is generated at the interface between the semiconductor layer 1b and the front surface protective film 6 at the outer peripheral end of the field insulating film 3, there is no supply of hydroxide ions near the outer peripheral end of the field insulating film 3, and $SiO_2$ does not precipitate. Therefore, it is possible to reduce an element defect due to the peeling of the field insulating film 3 and the front surface protective film 6.

In addition, when the impurity concentration of the termination well region 2 is large, or when the distance between the termination well region 2 and the floating well region 7 is short, a depletion layer extending from the pn junction interface between the semiconductor layer 1b and the termination well region 2 may extend to the outer periphery of the floating well region 7. In this case, since no potential difference is generated at the interface between the semiconductor layer 1b and the front surface protective film 6 at the outer peripheral end of the field insulating film 3, there is no supply of hydroxide ions near the outer peripheral end of the field insulating film 3, and $SiO_2$ does not precipitate. However, a potential difference may occur at the interface between the semiconductor layer 1b and the front surface protective film 6 on the outer peripheral side of the floating well region 7, and $SiO_2$ may be precipitated by the supply of hydroxide ions. In this case, since the precipitation of $SiO_2$ is at a position away from the outer peripheral end of the field insulating film 3, peeling between the field insulating film 3 and the front surface protective film 6 can be prevented.

In addition, similar to the first embodiment, even when the arrangement of the termination well region, the floating well region 7, the field insulating film 3, and the front surface protective film 6 has the same relationship as in FIG. 5, FIG. 6, FIG. 7, FIG. 8, FIG. 9, and FIG. 10, precipitation of $SiO_2$ can be prevented in the region where the semiconductor layer 1b is in contact with the front surface protective film 6, and peeling between the field insulating film 3 and the front surface protective film 6 can be prevented.

<Effect>

As described above, according to the semiconductor device 200 of the present embodiment, the precipitation of $SiO_2$ at the outer peripheral end of the field insulating film 3 can be prevented, and the peeling between the field insulating film 3 and the front surface protective film 6 can be prevented.

Third Embodiment

In the present embodiment, the semiconductor device according to the above-described first and second embodiments is applied to a power conversion apparatus. Although the present invention is not limited to a specific power conversion apparatus, in the following, a case where the present invention is applied to a three-phase inverter will be described as a third embodiment.

Figure 13:
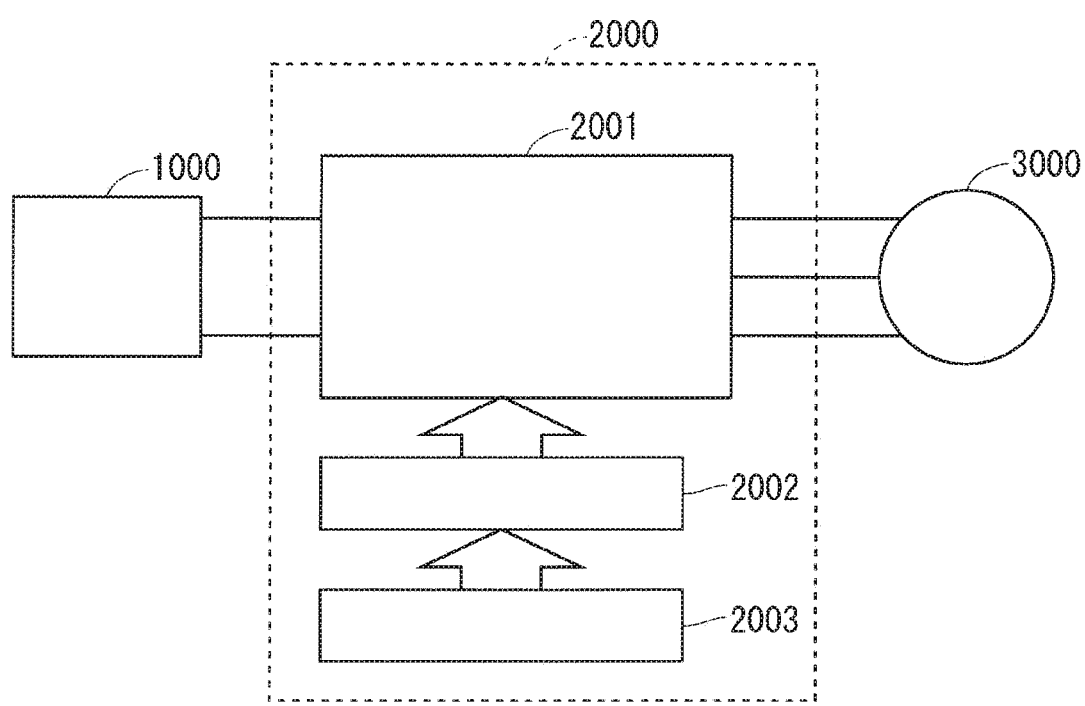
FIG. 13 is a diagram illustrating a power conversion apparatus according to a third embodiment of the present invention.

FIG. 13 is a block diagram illustrating a configuration of a power conversion system to which the power conversion apparatus according to the present embodiment is applied.

The power conversion system illustrated in FIG. 13 includes a power supply 1000, a power conversion apparatus 2000, and a load 3000. The power supply 1000 is a DC power supply, and supplies DC power to the power conversion apparatus 2000. The power supply 1000 can include various components, can include, for example, a DC system, a solar cell, and a storage battery, and may include a rectifier circuit or an AC/DC converter connected to an AC system. In addition, the power supply 1000 may include a DC/DC converter for converting DC power output from the DC system into predetermined power.

The power conversion apparatus 2000 is a three-phase inverter connected between the power supply 100 and the load 3000, converts DC power supplied from the power supply 100 into AC power, and supplies AC power to the load 3000. As illustrated in FIG. 13, the power conversion apparatus 2000 includes a main conversion circuit 2001 for converting DC power into AC power to output the converted power, a drive circuit 2002 for outputting a drive signal for driving each switching element of the main conversion circuit 2001, and a control circuit 2003 for outputting a control signal for controlling the drive circuit 2002 to the drive circuit 2002.

The load 3000 is a three-phase motor driven by AC power supplied from the power conversion apparatus 2000. It should be noted that the load 3000 is not limited to a specific application, and is a motor mounted on various electric apparatuses, and is used as, for example, a hybrid vehicle, an electric vehicle, a railway vehicle, an elevator, or a motor for an air conditioner.

Hereinafter, details of the power conversion apparatus 2000 will be described. The main conversion circuit 2001 includes a switching element and a freewheeling diode (not shown), and switching of the switching element converts the DC power supplied from the power supply 100 into AC power to supply the AC power to the load 3000. There are various specific circuit configurations of the main conversion circuit 2001, and the main conversion circuit 2001 according to the present embodiment is a two-level three-phase full bridge circuit and can include six switching elements and six freewheeling diodes antiparallel to the respective switching elements. The semiconductor device according to any one of the first and second embodiments described above is applied to at least any one of the respective switching elements and the respective freewheeling diodes of the main conversion circuit 2001. The six switching elements are connected in series for every two switching elements to constitute upper and lower arms, and the respective upper and lower arms constitute each phase (U phase, V phase, and W phase) of the full bridge circuit. Then, the output terminals of the respective upper and lower arms, that is, the three output terminals of the main conversion circuit 2001 are connected to the load 3000.

The drive circuit 2002 generates drive signals for driving the switching elements of the main conversion circuit 2001, and supplies the drive signals to the control electrodes of the switching elements of the main conversion circuit 2001. Specifically, in accordance with a control signal from a control circuit 2003 described below, a drive signal to turn on the switching element and a drive signal to turn off the switching element are output to the control electrodes of the respective switching elements. When the switching element is maintained in the ON state, the drive signal is a voltage signal not less than the threshold voltage of the switching element (ON signal), and when the switching element is maintained in the OFF state, the drive signal is a voltage signal not more than the threshold voltage of the switching element (OFF signal).

The control circuit 2003 controls the switching elements of the main conversion circuit 2001 so that desired power is supplied to the load 3000. Specifically, based on the power to be supplied to the load 3000, the time required for each switching element of the main conversion circuit 2001 to be turned on (ON time) is calculated. For example, the main conversion circuit 2001 can be controlled by PWM control for modulating the ON time of the switching element according to the voltage to be output. Then, a control instruction (control signal) is output to the drive circuit 2002 so that, at each time point, the ON signal is output to the switching element to be turned on and the OFF signal is output to the switching element to be turned off. The drive circuit 2002 outputs the ON signal or OFF signal as a drive signal to the control electrode of each switching element in accordance with the control signal.

In the power conversion apparatus according to the present embodiment, since the semiconductor device according to the first and second embodiments is applied as a switching element of the main conversion circuit 2001, reliability can be improved.

In the present embodiment, an example in which the present invention is applied to a two-level three-phase inverter is described, but the present invention is not limited to this, and can be applied to various power conversion apparatuses. In the present embodiment, a two-level power conversion apparatus is used, but a three-level or multilevel power conversion apparatus may be used, and when power is supplied to a single-phase load, the present invention may be applied to a single-phase inverter. In addition, when power is supplied to a DC load or the like, the present invention can be applied to a DC/DC converter or an AC/DC converter.

In addition, the power conversion apparatus to which the present invention is applied is not limited to the case where the load described above is a motor, and can also be used as a power supply device for, for example, an electrical discharge machine, a laser machine, an induction heating cooker, or a non-contact feeding system, and furthermore, can also be used as a power conditioner of a solar power generation system, a storage system, or the like.

In each of the above embodiments, quality of material, material, dimensions, shape, relative arrangement relationship, or condition of implementation of each component may be described, but these are illustrative in all aspects, and the present invention is not limited to those described. Thus, innumerable modifications not illustrated are envisaged within the scope of the present invention. For example, a case of deforming, adding, or omitting any component, and furthermore, a case of extracting at least one component in at least one embodiment to combine the extracted component with a component in another embodiment are included.

In addition, as long as no contradiction arises, the components described as being provided with "one" component in each of the above embodiments may be provided with "one or more" components. Furthermore, the component constituting the invention is a conceptual unit, and this includes a case where one component includes a plurality of structures and a case where one component corresponds to a part of a structure. In addition, each component of the present invention includes a structure having another structure or shape as long as the same function is exhibited.

In addition, the description herein is referred for all purposes of the present invention and none are deemed to be prior art.

It should be noted that in the present invention, each embodiment can be freely combined, and each embodiment can be appropriately modified, or omitted within the scope of the present invention. Although the present invention is described in detail, the above description is in all aspects illustrative, and the present invention is not limited to the above description. It is understood that innumerable modifications not illustrated can be envisaged without departing from the scope of the present invention.

EXPLANATION OF REFERENCE SIGNS

1$a$: semiconductor substrate
1$b$: semiconductor layer
2: termination well region
3: field insulating film 4: Schottky electrode
5: electrode pad
6: front surface protective film
7: floating well region
8: back surface electrode
9: p-type well
10: high concentration p region
11: n-type source
12: gate insulating film
13: gate electrode
14: interlayer insulating film
100: semiconductor device
200: semiconductor device
1000: power supply
2000: power conversion apparatus
2001: main conversion circuit
2002: drive circuit
2003: control circuit
3000: load

The invention claimed is:

1. A semiconductor device comprising:
a semiconductor substrate;
a semiconductor layer formed on the semiconductor substrate, the semiconductor layer being a first conductivity type;
a front surface electrode provided on a front surface side of the semiconductor layer;
a termination well region in which at least a part of the termination well region is formed to extend on an outer peripheral side with respect to an outer peripheral end of the front surface electrode in a surface layer of the semiconductor layer, the termination well region being a second conductivity type;
a field insulating film configured to cover at least a part of the termination well region, the field insulating film provided to extend to an outer peripheral side with respect to an outer peripheral end of the termination well region on a front surface of the semiconductor layer;
a resin layer configured to be in contact with an outer peripheral end of the field insulating film, the resin layer provided so that at least a part of the resin layer extends on the front surface of the semiconductor layer on the outer peripheral side with respect to the outer peripheral end of the field insulating film; and
a floating well region spaced apart from the termination well region in the surface layer of the semiconductor layer, the floating well region formed to be in contact with the outer peripheral end of the field insulating film to extend to the outer peripheral side with respect to the outer peripheral end of the field insulating film to be in contact with the resin layer, the floating well region having a floating potential and being a second conductivity type.

2. The semiconductor device according to claim 1, wherein a depth of the floating well region is larger than a width of a depletion layer formed from an interface between a bottom of the floating well region and the semiconductor layer to an inside of the floating well region.

3. The semiconductor device according to claim 1, wherein an inner peripheral end and an outer peripheral end of the floating well region are spaced apart from the outer peripheral end of the field insulating film by a distance larger than a width of a depletion layer formed from an interface between the floating well region and the semiconductor layer to an inside of the floating well region.

4. The semiconductor device according to claim 1, wherein
the resin layer includes a front surface protective film configured to cover a part of the front surface electrodes and at least a part of the field insulating film, the front surface protective film provided in contact with a front surface of the floating well region, and
the floating well region is provided to extend on an outer peripheral side with respect to an outer peripheral end of the front surface protective film.

5. The semiconductor device according to claim 4, wherein the floating well region is provided to extend to an outer peripheral end of the semiconductor layer.

6. The semiconductor device according to claim 1, wherein
the resin layer includes:
a front surface protective film configured to cover a part of the front surface electrode and at least a part of the field insulating film, the front surface protective film having an outer peripheral end positioned on an inner peripheral side with respect to the outer peripheral end of the field insulating film, and
a sealing gel provided in contact with a front surface of the floating well region.

7. The semiconductor device according to claim 1, wherein
when a dielectric constant of vacuum is denoted by $\varepsilon_0$ [F/m], a relative permittivity of the semiconductor layer is denoted by $\varepsilon_s$, an avalanche voltage of a semiconductor device is denoted by $V_{bd}$ [V], an elementary charge is denoted by q [C], and an impurity concentration of the semiconductor layer is denoted by $N_d$ [cm$^{-3}$], a distance [cm] from the outer peripheral end of the termination well region to the outer peripheral end of the field insulating film is not more than

[Mathematical Formula 1]

$$\sqrt{\frac{2\varepsilon_0 \varepsilon_s V_{bd}}{qN_d}}$$

8. The semiconductor device according to claim 1, wherein the floating well region includes at least one or more portions spaced apart in a peripheral direction in a plan view.

9. The semiconductor device according to claim 1, wherein a plurality of the termination well regions are formed to be separated from each other in a direction from an inner peripheral side toward an outer peripheral side.

10. The semiconductor device according to claim 1, wherein the termination well region is formed such that an impurity concentration decreases from an inner peripheral side toward an outer peripheral side.

11. The semiconductor device according to claim 1, wherein the semiconductor layer is silicon carbide.

12. The semiconductor device according to claim 1, wherein a diode is formed on an inner peripheral side of the termination well region.

13. The semiconductor device according to claim 1, wherein a transistor including at least one second conductivity type well region is formed on an inner peripheral side of the termination well region.

14. A power conversion apparatus comprising:
a main conversion circuit including a semiconductor device according to claim 1, the main conversion circuit configured to convert power to be input to output the converted power;
a drive circuit configured to output to the semiconductor device a drive signal for driving the semiconductor device; and
a control circuit configured to output to the drive circuit a control signal for controlling the drive circuit.

\* \* \* \* \*